United States Patent [19]

Chiang et al.

[11] 4,147,562
[45] Apr. 3, 1979

[54] PYROELECTRIC DETECTOR

[75] Inventors: Alice M. Chiang, Weston; Neal R. Butler, Acton, both of Mass.

[73] Assignee: Honeywell Inc., Minneapolis, Minn.

[21] Appl. No.: 813,018

[22] Filed: Jul. 5, 1977

[51] Int. Cl.² ............................................. H01L 35/02
[52] U.S. Cl. .................................. 136/213; 29/592 E; 250/336; 250/338; 427/100; 338/18; 307/413
[58] Field of Search ...................... 29/592 E; 136/213; 250/336, 338; 307/88 ET; 338/18; 427/100

[56] References Cited

U.S. PATENT DOCUMENTS

| | | | |
|---|---|---|---|
| 3,769,096 | 10/1973 | Ashkin et al. | 136/213 |
| 3,772,518 | 11/1973 | Murayama et al. | 250/211 R |
| 3,794,986 | 2/1974 | Murayama | 307/88 |
| 3,809,920 | 5/1974 | Cohen et al. | 307/88 ET |
| 3,824,098 | 7/1974 | Bergman, Jr. et al. | 96/1.5 |
| 3,885,301 | 5/1975 | Murayama | 29/592 R |
| 3,912,830 | 10/1975 | Murayama | 427/100 |

FOREIGN PATENT DOCUMENTS 1376372 12/1974 United Kingdom.
1377891 12/1974 United Kingdom.

OTHER PUBLICATIONS

Glass et al., Journal of Applied Physics, vol. 42, No. 13, 1971, pp. 5219 to 5222.
Spivack, The Review of Scientific Instruments, vol. 43, No. 7, Jul., 1972, pp. 985 and 987 to 990.

Primary Examiner—Leland A. Sebastian
Attorney, Agent, or Firm—David R. Fairbairn; Theodore F. Neils

[57] ABSTRACT

A pyroelectric detector as formed by parylene C polymer film.

9 Claims, 5 Drawing Figures

PYROELECTRIC DETECTOR

ORIGIN OF THE INVENTION

The present invention was made in the course of a contract with the Department of Army.

BACKGROUND OF THE INVENTION

This invention relates to pyroelectric devices. In particular, the present invention relates to use of parylene C polymer film for pyroelectric devices.

Pyroelectric detectors are a class of thermal detectors which utilize an electrically poled pyroelectric material. When the pyroelectric material is subjected to a change in temperature, the electrical polarization of the material changes, thereby producing a voltage across the pyroelectric material. In other words, the pyroelectric detector can be characterized essentially as a capacitor upon which a time varying charge, and consequently a voltage, appears when the temperature of the detector is changed. Since the pyroelectric effect is a direct result of the temperature dependence of the polarization, it can be used as a means of detecting infrared radiation energy.

Recently, pyroelectric detectors have attracted great attention due to their potential for low cost, medium to high performance, and room temperature operation. Substantial effort has been spent by many researchers to improve the performance of pyroelectric detectors utilizing ferroelectric crystals such as SBN, TGS, LiTaO$_3$. The state of the art single element pyroelectric detector performance is a D* of about $1 \times 10^9$ cm Hz$^{\frac{1}{2}}$/W at 10 Hz. Detectors with thickness of about 3 microns have been fabricated from these ferroelectric crystals.

In addition to the ferroelectric crystals, certain organic polymers also exhibit pyroelectric effects. Considerable research effort has been expended in studying polyvinyl chloride, polyvinyl fluoride (PVF), polyvinylidene chloride, polyvinylidene fluoride (PVF$_2$), polyacrylometide (PAN), polyacrylonitrile, and poly-o-fluorostyrene. Polymer pyroelectric devices are described in the following U.S. Pat. Nos. 3,769,096 by Askin, et al.; 3,772,518 by Mureyama, et al.; 3,794,986 by Mureyama; 3,809,920 by Coen, et al., 3,824,098 by Bergman, Jr., et al.; 3,885,301 by Mureyama; 3,912,830 by Mureyama, et al.; and British Pat. Nos. 1,376,372 and 1,377,891. A technical article describing the pyroelectric properties of PVF$_2$ is Appl. Phys., 42, 5219 (1971).

Parylene C is a polymer material which has found use as a window for X-ray radiation detectors. The properties of parylene C and related polymers parylene N and M are discussed in a M. A. Spivack, "Mechanical Properties of Very Thin Polymer Films," Rev. Sci., Instru., 43, 985 (1972). Unsupported, thin parylene films have been prepared and are available in thicknesses down to 0.025 microns. They have extremely uniform thickness, are pin-hole free, have high thermal resistance, are highly insulating, and are extremely mechanically rugged. The typical use of the parylene films as windows for X-ray detectors implies that they have the mechanical strength to support significant pressure differences. Despite the studies of parylene polymers, there has been no report of any parylene polymer being electrically poled, or of pyroelectric behavior in any parylene polymer.

SUMMARY OF THE INVENTION

It has been discovered that electrically poled parylene C polymer film exhibits pyroelectric response. Parylene C is a highly attractive new pyroelectric detector material.

BRIEF DESCRIPTION OF THE DRAWINGS

FIG. 1 shows a pyroelectric detector formed by a parylene C polymer film.

FIG. 2 shows normalized resistivity as a function of frequency for parylene C pyroelectric detectors.

DETAILED DESCRIPTION OF THE PREFERRED EMBODIMENT

We have discovered that parylene C polymer film can be electrically poled and, when electrically poled, exhibits a substantial pyroelectric response. FIG. 1 shows a parylene C pyroelectric detector. A thin film of parylene C polymer film 10 is stretched over the opening of a glass capillary 12. Electrodes 14 and 16 are attached to opposite surfaces of parylene C film.

In one successful embodiment of the invention, the parylene C film, which was supplied by Union Carbide Corporation, had a thickness of about 20 microns. The area of the detector was $7.07 \times 10^{-2}$ cm$^2$.

An important characteristic which is required for successful pyroelectric device application is the ability of the pyroelectric material to be electrically poled. Prior to the present invention, there were no reports of electrical poling of any parylene polymer.

The chemical structure of parylene C is:

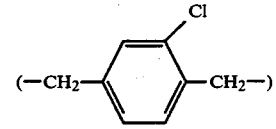

This chemical structure, with the extra chlorine atom attached to the carbon atoms of poly (chloro-p-xylylene) suggests that parylene C is potentially polarizable (i.e. an ionic displacement polarization may be imposed on this film by proper poling).

In one embodiment of the present invention, the 20 micron thick parylene C film was poled at 120° C. in a dry nitrogen atmosphere. The parylene C film poled in this manner exhibited pyroelectric response. This is apparently the first time either electrical poling or pyroelectric response has been observed in parylene C.

Figure 4:
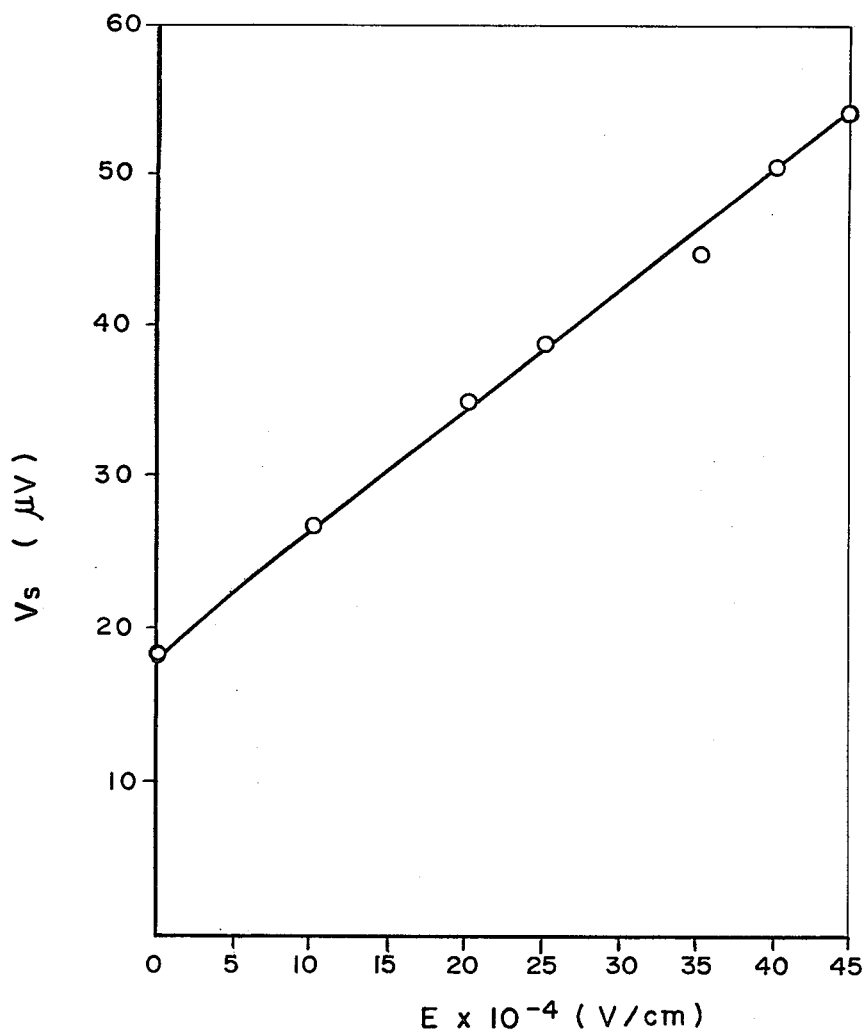
FIG. 4 shows parylene C pyroelectric response as a function of bias electric field.
Figure 5:
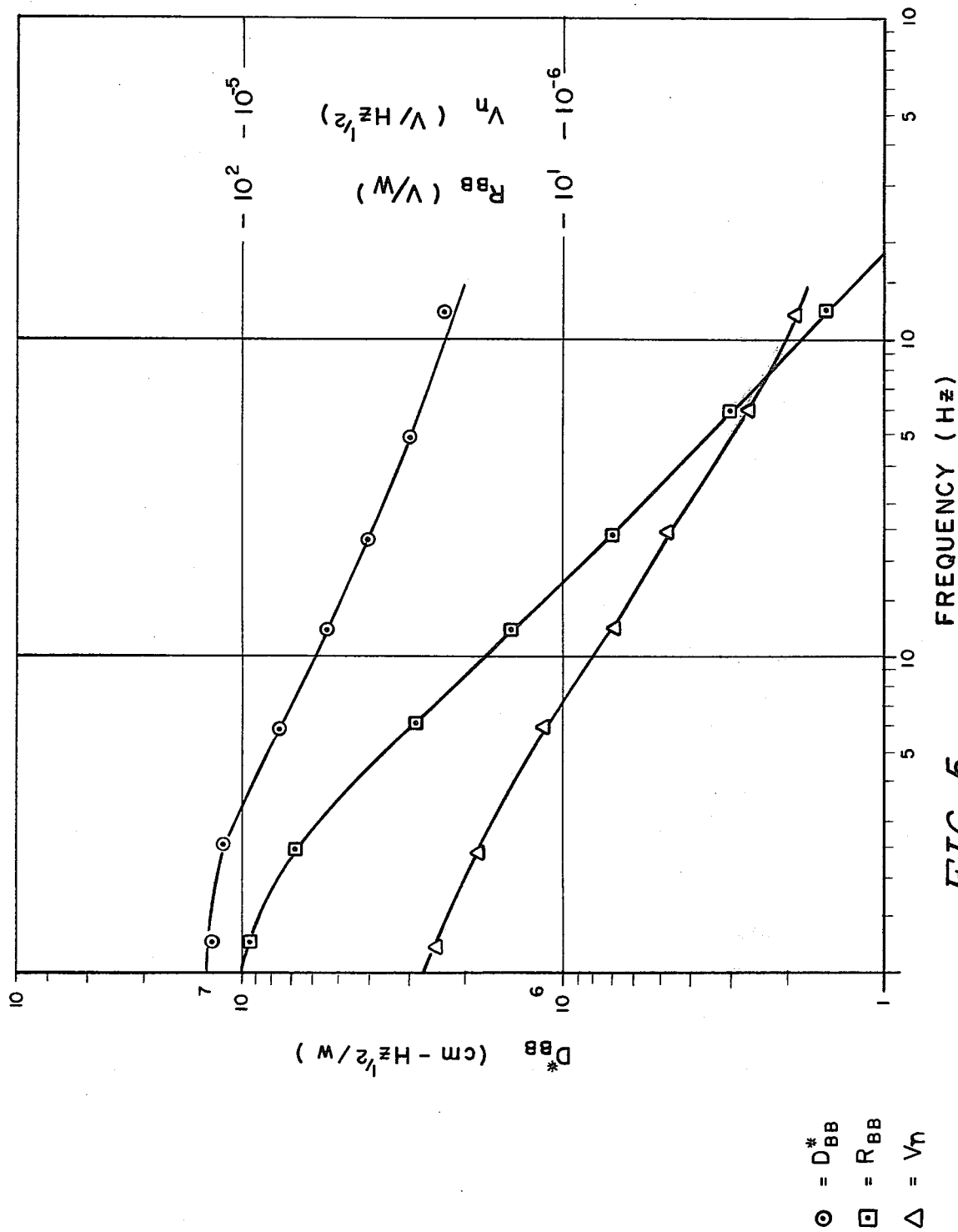
FIG. 5 shows detectivity D*$_{BB}$, responsivity R$_{BB}$, and noise voltage V$_n$ as a function of frequency for a parylene C pyroelectric detector.

FIGS. 2, 4 and 5 show the results of pyroelectric test measurements made on the parylene C pyroelectric detector. FIG. 2 is a plot of normalized responsivity R$_V$ versus frequency for parylene C detectors having long and short leads.

Figure 3:
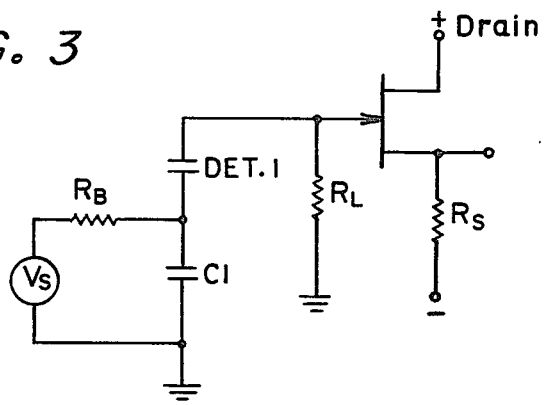
FIG. 3 shows a biasing circuit used in conjunction with certain tests on the parylene C pyroelectric detector.

It was discovered that the pyroelectric response of parylene C detectors could be increased by applying a bias electric field. FIG. 3 shows the circuit used to measure pyroelectric response as a function of bias electric field, and FIG. 4 shows the resuts of these test measurements.

In FIG. 3, a bias voltage was applied across pyroelectric detector DET1 by voltage source $V_S$ and resistor $R_B$. The voltage from $V_S$ was varied between 0 and 1 KV. The drain of FET1 was connected to a positive voltage, and the source was connected through resistor $R_S$ to a negative voltage. The output signal was derived from the source of FET1.

During the tests, the incident irradiance on the parylene C pyroelectric detector DET1 was $6.75 \times 10^{-5} W/cm^2$. The chopping frequency was 24 Hz.

As shown in FIG. 4, the signal voltage, $V_S$, from the parylene C detector increased nearly linearly with increasing bias electric field. An increase in signal voltage by a factor of about 2.5 was achieved with an increase in bias electric field from 0 V/cm to $45 \times 10^{+4}$ V/cm bias field.

FIG. 5 shows detectivity $D^*_{BB}$, responsivity $R_{BB}$ and noise voltage $V_n$ as a function of frequency for a parylene C pyroelectric detector. These measurements were made about 4 weeks after the detector had been electrically poled. The detector area was about 0.07 cm$^2$ and the thickness was 20 microns. As shown in FIG. 5, the detectivity exceeded $10^7$ cm Hz$^{\frac{1}{2}}$/W at low frequencies (less than about 3 Hz). These measurements are very encouraging, since no attempt had been made to optimize the electrical poling of the parylene C itself. With proper poling and reduced detector thickness (preferably less than 1 micron), $10^9$ detectivity at a few hundred Hz chopping frequency appears possible.

Parylene C polymer films have considerable potential for pyroelectric devices, particularly to detector arrays which are direct coupled to charged coupled devices (CCD's). Parylene C offers the following advantages for large area pyroelectric mosaic applications: (1) ease of fabrication of large area thin samples, (2) low dielectric constant required for direct coupling to CCD's, (3) low cost, and (4) low thermal diffusivity.

The ability to prepare very thin parylene C film is a substantial advantage in obtaining detector performance goals. For a well designed, thermally isolated pyroelectric detector, the $D^*$ rolls off as a function of $1/(f)^{\frac{1}{2}}$ in the region $f > f_o$, where $f_o = 1/2\pi\tau_{th}$, and $\tau_{th}$ is the detector thermal time constant. Using a lumped thermal loss model, $\tau_{th}$ can be simply repressed as:

$$\tau_{th} = c_p d/g \quad (1)$$

where $c_p$ is the detector volume specific heat, d is the detector thickness, and g is the lumped thermal conductance per unit area. Equation (1) clearly demonstrates that the thinner the detector thickness, the faster is the detector thermal response time. Thus, one can expect better $D^*$ at higher frequencies without too stringent a requirement on the pyroelectric material figure of merit, $p/(\epsilon)^{\frac{1}{2}}$ where p and $\epsilon$, are the material pyroelectric coefficient and dielectric constant, respectively.

For example, for a pyroelectric detector with a thickness of 2000Å, $c_p$ of 1.9 Joule/° K. cm$^3$ and g of $2.4 \times 10^{-2}$ W/° K. cm$^2$, a thermal time constant of 1.5 ms is obtainable. The detector noise limited $D^*$ of $1 \times 10^9$ cm Hz$^{\frac{1}{2}}$/W at 100 Hz can be achieved with a pyroelectric material having a $p(\epsilon)^{\frac{1}{2}}$ ratio of $8 \times 10^{-10}$ coul/° K. cm$^2$ and dissipation factor 0.005. Among the commonly known pyroelectric polymers, both PVF and PVF$_2$ have $p/(\epsilon)^{\frac{1}{2}}$ ration larger than $8 \times 10^{-10}$.

Presently, PVF$_2$ is the most commonly used polymeric pyroelectric material. PVF$_2$ detectors with $1 \times 10^9$ detectivity at 4 Hz have been reported. Detector grade PVF$_2$ is typically prepared by a technique of extrusion and then stretching. A 4 $\mu$m thickness is probably the limit of the thinnest sample which can be prepared by this technique.

In order to reach $1 \times 10^9$ cm Hz$^{\frac{1}{2}}$/W at 100 Hz, therefore, a new material is needed. Parylene c appears to fill this need. Unsupported, thin parylene films have been prepared and are available in thicknesses down to 0.025 $\mu$m. These parylene polymers are extremely uniform in thickness, pin-hole free, high thermal resistance, highly insulating and extremely mechanically rugged. The thickness requirements, therefore are met by parylene C.

Another advantage of parylene C is that the dielectric constant of the film is about 3.15. One criteria for directly introducing a pyroelectric signal into the MOSFET input of a CCD requires that the dielectric constant of the detector material is the same, or preferably less than that of SiO$_2$ ($\epsilon = 3.9$)

Parylene C polymer film, therefore, possesses all the mechanical and dielectric properties of a pyroelectric material which is needed for a large element pyro/CCD focal plane. These factors, combined with the demonstrated pyroelectric response, make parylene C an attractive pyroelectric material.

In conclusion, we have demonstrated that parylene C polymer film is capable of being electrically poled and has a substantial pyroelectric response. The pyroelectric, mechanical and dielectric properties of parylene C make it an attractive new pyroelectric detector material. While the invention has been described with reference to preferred embodiment, workers skilled in the art will recognize the changes made in form and detail without departing from the spirit and scope of the present invention. For example, although certain applications of parylene C pyroelectric material have been discussed, other applications and configurations for pyroelectric devices are also possible and contemplated as a part of the present invention.

The embodiments of the invention in which an exclusive property or right is claimed are defined as follows:

1. A pyroelectric device comprising:
   an electrically poled body of parylene C polymer; and
   means for deriving a pyroelectric response from the body.

2. The pyroelectric device of claim 1 wherein the body is a film.

3. The pyroelectric device of claim 2 wherein the film has a thickness of $\leq$ about 20 microns.

4. The pyroelectric device of claim 3 wherein the film has a thickness of less than about 1 micron.

5. The pyroelectric device of claim 1 wherein the means for deriving a pyroelectric response comprise electrode means attached to the body.

6. The pyroelectric device of claim 5 wherein the electrode means comprise electrodes attached to opposite surfaces of the body.

7. The pyroelectric device of claim 1 and further comprising:
   biasing means for applying a bias electric field to the body.

8. A method of detecting thermal radiation comprising:

subjecting an electrically poled parylene C film to thermal radiation; and
sensing a pyroelectric response from the film.

9. A pyroelectric device comprising:
a body of a pyroelectric medium consisting essentially of a normally solid polymer of parylene C; and
means for sensing a pyroelectric response by the body to incident radiation.

* * * * *